United States Patent
Huang et al.

(10) Patent No.: US 9,466,573 B2
(45) Date of Patent: Oct. 11, 2016

(54) RF SOI SWITCH WITH BACKSIDE CAVITY AND THE METHOD TO FORM IT

(71) Applicant: SEMICONDUCTOR MANUFACTURING INTERNATIONAL (SHANGHAI) CORPORATION, Shanghai (CN)

(72) Inventors: Herb He Huang, Shanghai (CN); Zhongshan Hong, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 0 days.

(21) Appl. No.: 15/018,763

(22) Filed: Feb. 8, 2016

(65) Prior Publication Data

US 2016/0155707 A1  Jun. 2, 2016

Related U.S. Application Data

(62) Division of application No. 14/495,884, filed on Sep. 24, 2014, now Pat. No. 9,293,472.

(30) Foreign Application Priority Data

Nov. 28, 2013 (CN) .......................... 2013 1 0627131

(51) Int. Cl.
| | |
|---|---|
| H01L 21/3105 | (2006.01) |
| H01L 23/552 | (2006.01) |
| H01L 29/04 | (2006.01) |
| H01L 29/06 | (2006.01) |
| H01L 29/78 | (2006.01) |
| H01L 29/66 | (2006.01) |
| H01L 23/66 | (2006.01) |

(52) U.S. Cl.
CPC ............. *H01L 23/552* (2013.01); *H01L 23/66* (2013.01); *H01L 29/045* (2013.01); *H01L 29/0649* (2013.01); *H01L 29/66651* (2013.01); *H01L 29/7838* (2013.01); *H01L 2223/6616* (2013.01)

(58) Field of Classification Search
CPC ............... H01L 23/552; H01L 29/045; H01L 29/66651; H01L 23/66; H01L 29/7838; H01L 29/0649; H01L 2223/6616
See application file for complete search history.

(56) References Cited

U.S. PATENT DOCUMENTS

| | | | |
|---|---|---|---|
| 6,461,903 B2 * | 10/2002 | Lee ................... | H01L 29/66772 257/E21.415 |
| 7,019,364 B1 * | 3/2006 | Sato ....................... | B82Y 20/00 257/347 |
| 7,754,517 B2 * | 7/2010 | Iinuma ...................... | G01J 5/02 257/E31.127 |
| 2004/0129998 A1 * | 7/2004 | Inoh .................. | H01L 21/76283 257/501 |

* cited by examiner

*Primary Examiner* — Marc Armand
*Assistant Examiner* — Sue Tang
(74) *Attorney, Agent, or Firm* — Kilpatrick Townsend & Stockton, LLP (57) ABSTRACT

An integrated circuit includes a compound semiconductor substrate having a first semiconductor substrate, an insulating layer on the first semiconductor substrate, and a second semiconductor substrate on the insulating layer, a transistor disposed on the second semiconductor substrate and having a bottom insulated by the insulating layer, a plurality of shallow trench isolations disposed on opposite sides of the transistor, a cavity disposed below the bottom of the transistor, and a plurality of isolation plugs disposed on opposite sides of the cavity. By having a cavity located below the transistor, parasitic couplings between the transistor and the substrate are reduced and the performance of the integrated circuit is improved.

5 Claims, 5 Drawing Sheets

RF SOI SWITCH WITH BACKSIDE CAVITY AND THE METHOD TO FORM IT

CROSS-REFERENCES TO RELATED APPLICATIONS

This application is a divisional application of U.S. patent application Ser. No. 14/495,884, filed Sep. 24, 2014, which claims priority to Chinese patent application No. 201310627131.8, filed on Nov. 28, 2013, the content of both applications are incorporated herein by reference in their entirety.

BACKGROUND OF THE INVENTION

The present invention relates to semiconductor devices, and more particularly to an integrated circuit having a transistor for radio frequency applications and methods of manufacturing the same.

A field effect transistor typically includes a silicon substrate, an impurity doped source and an impurity doped drain separated by a channel region. A gate insulation layer is disposed atop the channel region and a gate electrode made from electrically conductive material is located on top of the gate insulation layer.

Field effect transistors are employed as switching devices in wireless communications devices, e.g., mobile phones, tablet PCs, and the like. A radio frequency (RF) switching device is typically a key component in RF front-end modules and is required to have high signal integrity, low insertion loss, good linear characteristics, and low signal distortion.

However, due to the high frequency range in the radio frequency applications, source to drain leakage and parasitic capacitive coupling through the substrate can be relatively large and affect the performance (i.e., low insertion loss, good linear characteristics, and low signal distortion) of the field effect transistor.

Therefore, there exists a need for an integrated circuit structure having low parasitic capacitive coupling and high switching speed and a method of manufacturing such structure.

BRIEF SUMMARY OF THE INVENTION

In accordance with the invention, a circuit integrated (integrated circuit) into a substrate and having improved radio frequency characteristics includes a compound semiconductor substrate having a first semiconductor substrate, an insulating layer on the first semiconductor substrate, and a second semiconductor substrate on the insulating layer, and a transistor disposed in the second semiconductor substrate and having a bottom portion insulated by the insulating layer. The integrated circuit also includes a plurality of shallow trench isolations disposed on opposite sides of the transistor, a cavity disposed below (underneath) the bottom portion of the transistor, and a plurality of isolation plugs disposed on opposite sides of the cavity. By having a cavity located below the transistor, parasitic capacitive couplings between the source, drain of the transistor and the substrate are reduced and the performance of the integrated circuit is improved.

In an embodiment, the cavity is located at the upper portion of the first semiconductor substrate and has a top surface covered (insulated) by the insulating layer. The cavity may have a height in the range between 0.1 um (micron) and 10 um, preferably between 1 um and 2 um.

In an embodiment, the cavity is separated from other adjacent cavities by isolation plugs. Each of the isolation plugs is made through a shallow trench isolation and the insulating layer and has the bottom end extending into the first semiconductor substrate. The extended portion into the first semiconductor substrate of the isolation plugs may have a depth of greater than 100 nm. The isolation plugs may comprise a silicon oxide ($SiO_2$) material, a fluorine doped silica glass (FSG), a high-density plasma oxide (HDP oxide) material, or a low-k dielectric material (k<4).

In an embodiment, the integrated circuit further includes a dielectric layer overlying the transistor and covering the top surface of the transistor. The dielectric layer may comprise a silicon oxide ($SiO_2$) material, a fluorine doped silica glass (FSG), a high-density plasma oxide (HDP oxide) material, or a low-k dielectric material (k<4).

In an embodiment, the dielectric layer and the isolation plugs may be formed of the same material.

In an embodiment, the insulating layer is an oxide layer.

In an embodiment, the first semiconductor substrate is a silicon layer having a plane orientation (111), and the second semiconductor substrate is a silicon layer having a plane orientation (111).

In an embodiment, the transistor is a metal oxide semiconductor field effect transistor (MOSFET).

In an embodiment, the integrated circuit is a radio frequency switching device. In another embodiment, the integrated circuit comprises a radio frequency front-end module, and the transistor is a switching device in the radio frequency front-end module.

A method of manufacturing an integrated circuit includes providing a compound semiconductor substrate having a first semiconductor substrate, an insulating layer on the first semiconductor substrate, and a second semiconductor substrate on the insulating layer, forming a protective layer on the second semiconductor substrate, forming a shallow trench isolation through the protective layer and the second semiconductor substrate, and forming a plurality of via holes through the shallow trench isolation and the insulating layer and extending into a portion of the first semiconductor substrate. The method also includes selectively removing a lateral portion of the first semiconductor substrate to form a continuous cavity area connecting (i.e., in communication with) the via holes in the horizontal direction, filling the via holes with a dielectric material and performing a chemical mechanical polishing process to remove excess of the dielectric material to form isolation plugs that divide the continuous cavity area into a plurality of separate cavities, removing a portion of the shallow trench isolations and a portion of isolation plugs that are higher than the second semiconductor substrate and the protective layer, and forming a transistor in a portion of the substrate disposed between two adjacent shallow trench isolations. The method further includes forming a dielectric layer on the transistor and covering the top surface of the transistor. The method also includes forming contact vias over source and drain regions of the transistor.

The following description, together with the accompanying drawings, will provide a better understanding of the nature and advantages of the claimed invention.

DETAILED DESCRIPTION OF THE INVENTION

It should be understood that the drawings are not drawn to scale, and similar reference numbers are used for representing similar elements. As used herein, the terms "example embodiment," "exemplary embodiment," and "present embodiment" do not necessarily refer to a single embodiment, although it may, and various example embodiments may be readily combined and interchanged, without departing from the scope or spirit of the present invention. Furthermore, the terminology as used herein is for the purpose of describing example embodiments only and is not intended to be a limitation of the invention. In this respect, as used herein, the term "in" may include "in" and "on", and the terms "a", "an" and "the" may include singular and plural references. Furthermore, as used herein, the term "by" may also mean "from", depending on the context. Furthermore, as used herein, the term "if" may also mean "when" or "upon", depending on the context. Furthermore, as used herein, the words "and/or" may refer to and encompass any possible combinations of one or more of the associated listed items.

It will be understood that, although the terms "first," "second," "third," etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

The term "horizontal" as used in this application is defined as a plane parallel to the conventional plane or surface of a wafer or substrate, regardless of the orientation of the wafer or substrate. The term "vertical" refers to a direction perpendicular to the horizontal as defined above. Prepositions, such as "on", "side" (as in "sidewall"), "below", "underneath", "above", "higher", "lower", "over" and "under" are defined with respect to the conventional plane or surface being on the top surface of the wafer or substrate, regardless of the orientation of the wafer or substrate. It will be understood that these terms are intended to encompass different orientations of the device in addition to the orientation depicted in the figures.

It will be further understood that the terms "comprising", "including", having" and variants thereof, when used in this specification, specify the presence of stated features, steps, operations, elements, and/or components, but do not preclude the presence or addition of one or more other features, steps, operations, elements, components, and/or groups thereof. In contrast, the term "consisting of" when used in this specification, specifies the stated features, steps, operations, elements, and/or components, and precludes additional features, steps, operations, elements and/or components.

Embodiments of the invention are described herein with reference to cross-section illustrations that are schematic illustrations of idealized embodiments (and intermediate structures) of the invention. The thickness of layers and regions in the drawings may be exaggerated for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a discrete change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

The following detailed description is, therefore, not to be taken in a limiting sense, and the scope of the present invention is defined only by the appended claims, along with the full scope of equivalents to which such claims are entitled.

First Embodiment

An integrated circuit includes a transistor disposed on a semiconductor substrate having a cavity disposed below (underneath) the transistor. The transistor can be isolated from the semiconductor substrate through the cavity, and the parasitic coupling between the source, the drain, and the gate of the transistor, and the parasitic capacitive coupling of the semiconductor substrate can be reduced to ultimately improve the performance of the integrated circuit.

Figure 1:
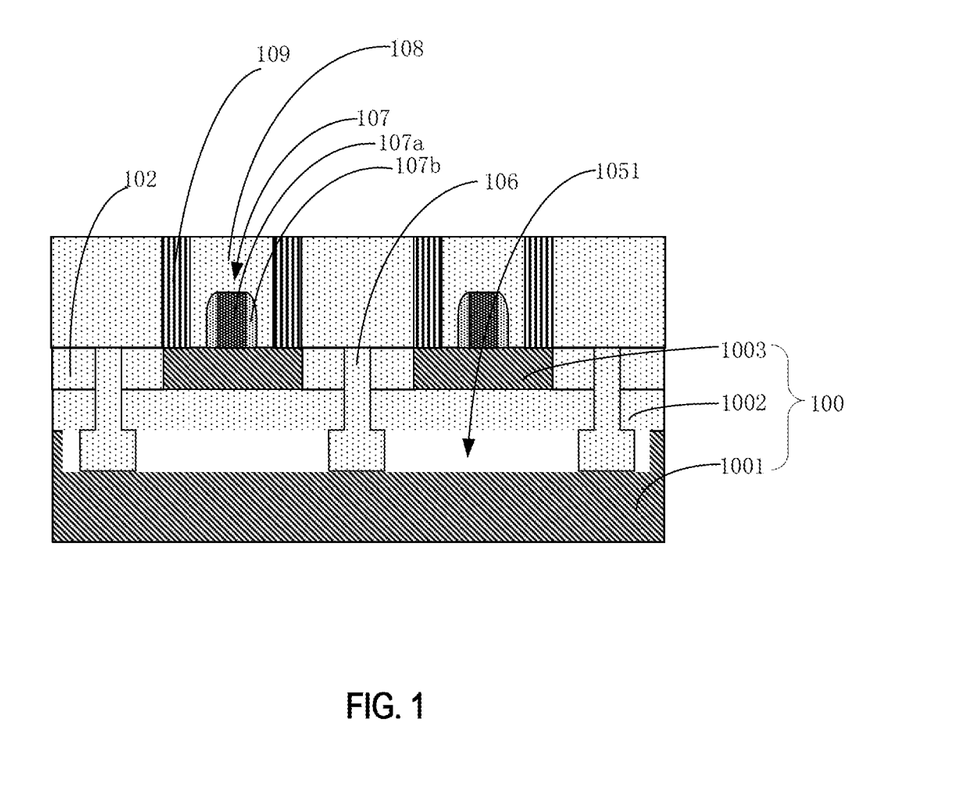
FIG. 1 is a cross-sectional view of a structure of an integrated circuit according to an embodiment of the present invention.

FIG. 1 is a cross-sectional view of a structure of an integrated circuit according to an embodiment of the present invention. As shown in FIG. 1, the integrated circuit includes a compound semiconductor substrate 100 and a transistor 107 disposed in the compound semiconductor substrate. The compound semiconductor substrate includes a first semiconductor substrate 1001, an insulating layer 1002 on the first semiconductor substrate, and a second semiconductor substrate 1003 on the insulating layer. Transistor 107 is disposed in the second semiconductor substrate and includes a gate dielectric layer (not shown), a gate electrode 107a, a gate spacer 107b, a source region (not shown) and a drain region (not shown), and a channel region (not shown) disposed between the source and the drain regions. The bottom portion of transistor 107 is insulated by insulating layer 1002. Multiple shallow trench isolations 102 separate the different transistors. A cavity 1051 is disposed in compound semiconductor substrate 100 below (underneath) transistor 107. An isolation plug 106 is disposed between two adjacent cavities 1051.

In the embodiment, the bottom portion of transistor 107 is referred to as the side of the transistor source, drain, and channel regions, and the top portion of transistor 107 is referred to the opposite side of the transistor bottom portion.

Referring to FIG. 1, cavity 1051 is disposed in an upper portion of first semiconductor substrate 1001 and isolated from transistor 107 through insulating layer 1002. In some embodiments, cavity 1051 may be disposed entirely within first semiconductor substrate 1001 so that the top surface of cavity 1051 is not in contact with insulating layer 1002. In some other embodiments, a portion of cavity 1051 may be disposed in insulating layer 1002. In yet other embodiments, cavity 1002 may be disposed entirely within insulating layer 1002. Cavity 1051 can be disposed in different ways relative to first semiconductor substrate 1001, insulating layer 1002, and third semiconductor substrate 1003. The relative location of cavity 1051 in compound semiconductor substrate 100 does not limit the present invention to the specific embodiments disclosed and described herein.

In an embodiment, cavity 1051 has a height in the range between 0.1 um and 10 um, and preferably between 1 um and 2 um.

Cavity 1051 may have a normal pressure, a vacuum, or a near-vacuum (low pressure). In a specific embodiment, cavity 1051 is in a vacuum state, or in a near-vacuum (low pressure) state.

Isolation plug 106 is disposed through shallow trench isolation 102 and insulating layer 1002. Isolation plug 106 has a bottom portion that is in contact with the top surface of first semiconductor substrate 1001 delineating together with the insulating layer cavity 1001, as shown in FIG. 1.

In an embodiment, isolation plug 106 includes silicon oxide (SiO2), fluorine-doped silicate glass (FSG), high-density plasma oxide (HDP oxide), or a low-k dielectric material. The low-k dielectric material is referred to as a dielectric material having a dielectric constant k less than 4 (k<4).

The integrated circuit further includes a dielectric layer 108 disposed over transistor 107 and isolates the top surface of transistor 107. Dielectric layer 108 may include silicon oxide (SiO2), fluorine-doped silicate glass (FSG), high-density plasma oxide (HDP oxide), or a low-k dielectric material.

In an embodiment, dielectric layer 108 and isolation plug 106 are formed of the same material so that they can be formed more closely together to better isolate transistor 107 at its bottom and sides and to prevent coupling of transistor 107 with the substrate and other neighboring devices. In an embodiment, the integrated circuit may also include a contact via 109 in contact with the source region and the drain region of transistor 107. Contact via 109 may comprise a conductive material.

Insulating layer 1002 can be an oxide layer or can have any suitable insulating materials.

In an embodiment, first semiconductor substrate is a silicon layer having a plane orientation (111), and second semiconductor substrate is a silicon layer having a plane orientation (111).

In an embodiment, transistor 107 is a metal oxide field effect transistor (MOSFET).

The integrated circuit according to the embodiment of the present invention may be any types of integrated circuits, such as a radio frequency switching device, a radio frequency front-end module (RF FEM), and transistor 107 is the switching device of the radio frequency RF FEM.

The integrated circuit of the embodiment may further include other components not shown in FIG. 1, such as MEMS devices, integrated passive devices (IPD), and the like. Those skilled in the art will appreciate that other transistors, for example, bipolar junction transistors (BJT), BiCMOS, CMOS, and other active or passive devices may be used without departing from the scope of the disclosure.

The integrated circuit of the present disclosure includes a cavity embedded in the semiconductor substrate below the transistor, the transistor is thus separated from the substrate through the cavity. Therefore, parasitic coupling between the source, drain, and gate of the transistor through the semiconductor substrate can be reduced, and parasitic capacitive coupling of the semiconductor substrate can be reduced, thereby improving the performance of the integrated circuit. In addition, insulating layer 1002 isolates the bottom portion of transistor 107, dielectric layer 108 isolates the top portion of transistor 107, shallow trench isolations 102 isolate transistor 107 from adjacent transistors, so that a maximum isolation of transistor 107 from the compound semiconductor substrate can be achieved, with respect to conventional devices (e.g., a RF semiconductor switching device). The embodiment can reduce the coupling effect of the substrate to a minimum, thereby further reducing signal distortion and insertion loss of the switching device and improving the integrated circuit performance.

Second Embodiment

Referring to FIGS. 2A through 2F and FIG. 3, embodiments of the present invention provide a method of manufacturing an integrated circuit. FIGS. 2A through 2F are cross-sectional views of intermediate stages at different points during a manufacturing method of an integrated circuit, in accordance with an embodiment of the present invention.

Figure 2A:
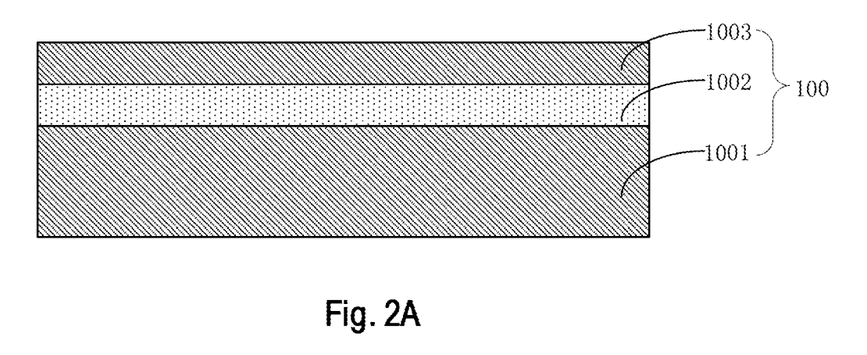
FIGS. 2A through 2F are cross-sectional views of intermediate stages of a method of manufacturing an integrated circuit according to an embodiment of the present invention.

According to an embodiment, a method of manufacturing an integrated circuit may include providing a compound semiconductor substrate having a first semiconductor substrate 1001, an insulating layer 1002 on first semiconductor substrate 1001, and a second semiconductor substrate 1002 on insulating layer 1002, as shown in FIG. 2A.

First semiconductor substrate 1001 is a silicon layer having a plane orientation (111), and second semiconductor substrate 1003 is a silicon layer having a plane orientation (111).

Insulating layer 1002 can be an oxide layer or a layer comprising any suitable insulating materials.

Because of the presence of insulating layer 1002, compound semiconductor substrate 100 (also referred to as "semiconductor substrate", or "substrate") can be referred to as a silicon-on-insulator (SOI) substrate.

Figure 2B:
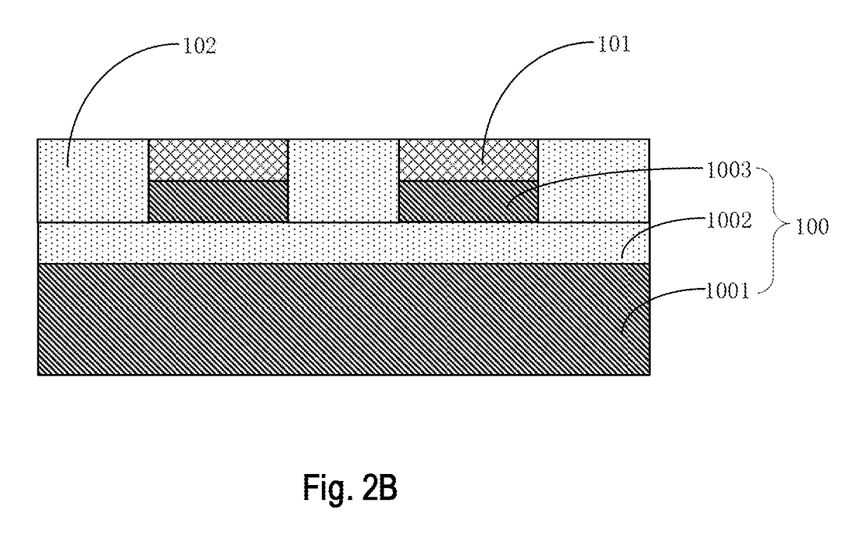

Thereafter, a protective layer 101 is formed on second semiconductor substrate 1003, and a shallow trench isolation 102 is formed through protective layer 101 and second semiconductor substrate 1003, as shown in FIG. 2B. As shown, shallow trench isolation 102 divides protective layer 101 and second semiconductor substrate 1003 into multiple separate portions.

Protective layer 101 may include silicon nitride or other suitable materials and be formed by deposition or other suitable processes.

For example, forming shallow trench isolation 102 may include etching through protective layer 101 and second semiconductor substrate 1003 to form a trench, and filling the trench with a dielectric material (e.g., oxide), performing a chemical mechanical polishing (CMP) process (planarizing) to remove excess of the dielectric material.

Figure 2C:
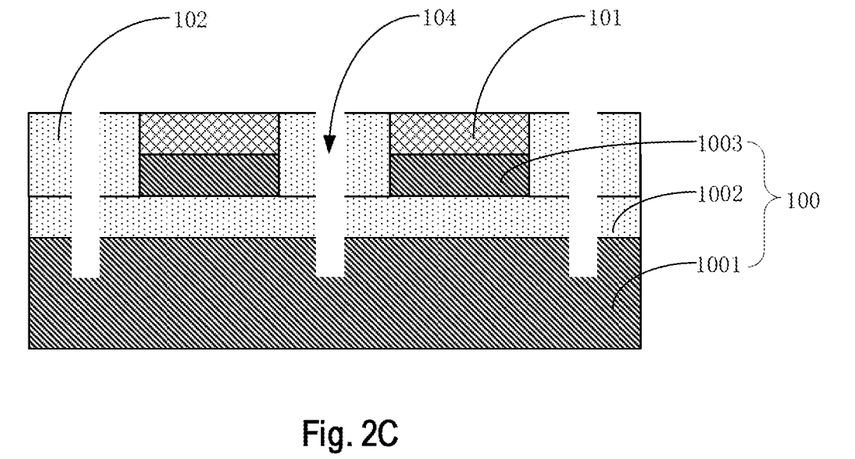

Thereafter, a via hole 104 is formed through shallow trench isolation 102 and insulating layer 1002, and via hole 104 is extending into a portion of first semiconductor substrate 1001, as shown in FIG. 2C. Via hole 104 may be formed by dry etching, wet etching, or other suitable etching processes.

In an embodiment, via hole 104 may be formed extending into first semiconductor substrate 1001 to a depth greater than 100 nm. Via hole 104 has an opening end facing upward and a bottom end facing first semiconductor substrate 1001, as shown in FIG. 2C. Furthermore, via hole 104 is not connected to other via holes.

Thereafter, a cavity area 105 is formed in an upper portion of first semiconductor substrate 1001 by selectively removing regions disposed between via holes 104. Cavity area 105 is a continuous hollow structure that is disposed in the upper portion of first semiconductor substrate 1001 and in communication with the via holes, as shown in FIG. 2D.

Cavity area 105 can be removing using selectively etching, e.g., a wet etching with an aqueous solution TMAH (tetramethyl ammonium hydroxide), KOH (potassium hydroxide), or $NH_3$—$H_2O$, and the like.

When first semiconductor substrate 1001 is a silicon layer having a plane orientation (111), a selective etching can be performed relatively easily to obtain a cavity area 105 on the upper region of first semiconductor substrate 1001.

Figure 2D:
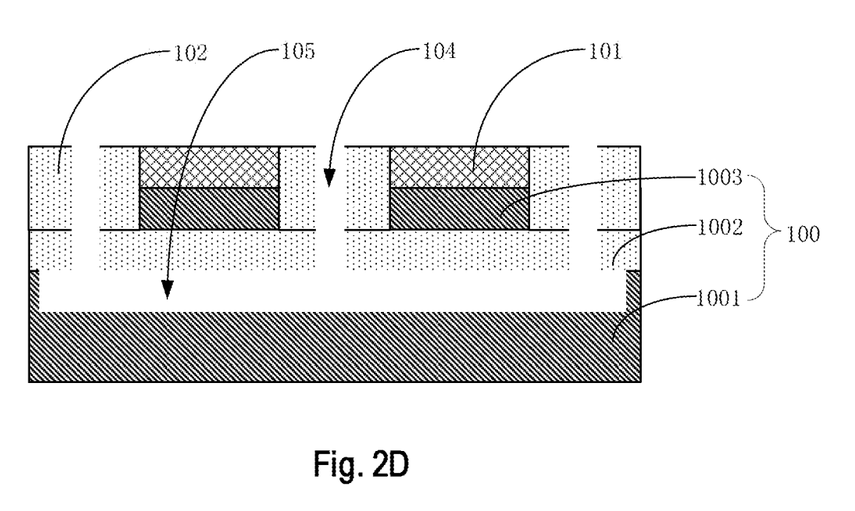

Cavity area 105 is a continuously hollow structure that is located below insulating layer 1002 and in the upper portion of first semiconductor substrate 1001, as shown in FIG. 2D.

Figure 2E:
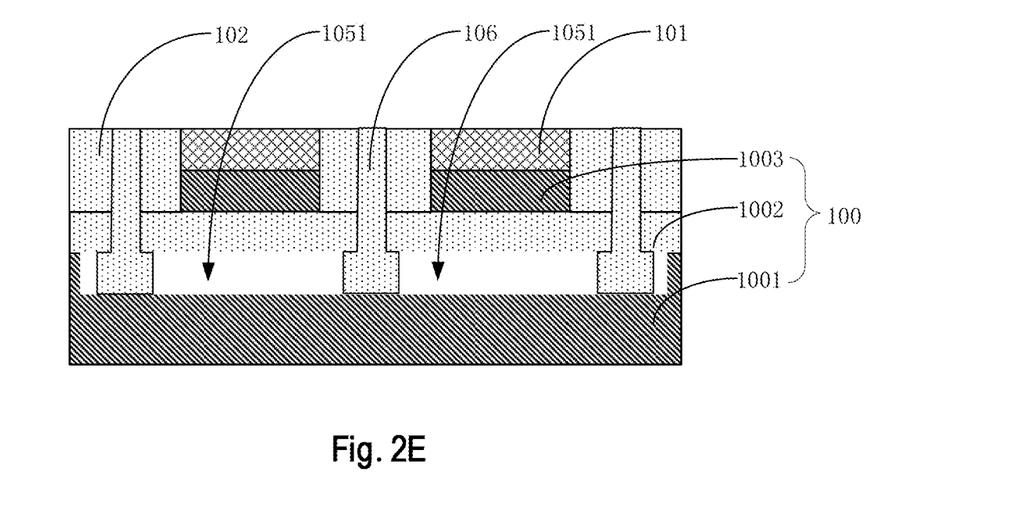

Thereafter, via hole 104 is filled with a dielectric material, and a CMP (chemical mechanical polishing) process is performed to remove excess of the dielectric material to form isolation plug 106. Isolation plug 106 divides the continuously hollow area (cavity area 105) into a plurality of separate cavities 1051, as shown in FIG. 2E. In other words, isolation plugs 106 together with insulating layer 102 delineate the cavities.

The dielectric material of isolation plug 106 may include silicon oxide, fluorine-doped silicate glass, high-density plasma oxide, or a low-k dielectric material.

In an embodiment, cavity 1051 has a height in the range between 0.1 um and 10 um, and preferably, between 1 um and 2 um.

Figure 2F:
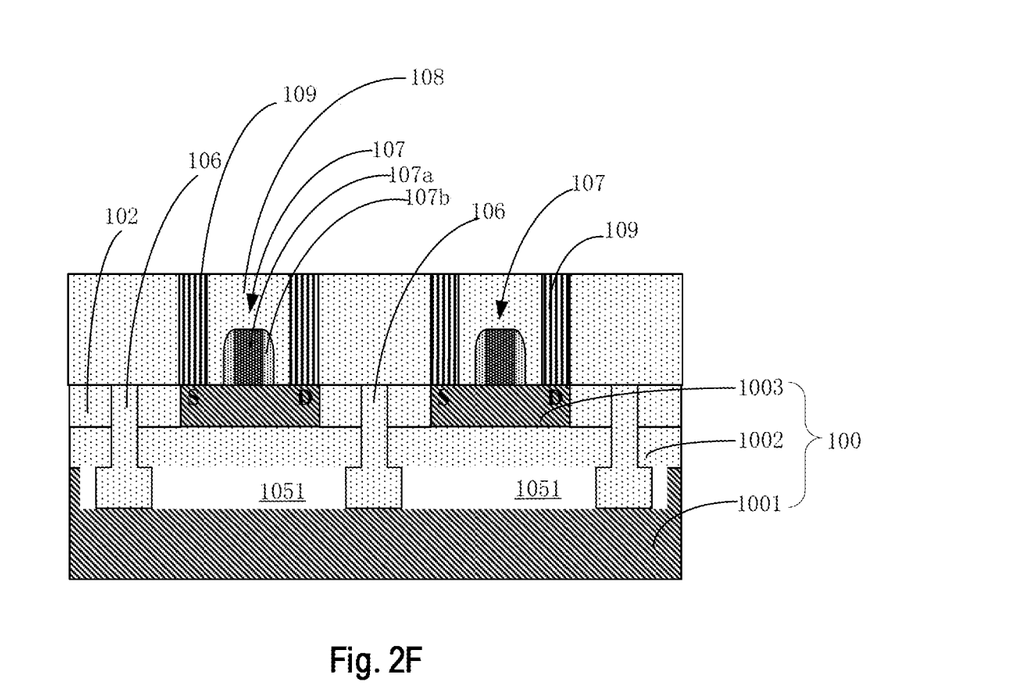

Thereafter, the portion of shallow trench isolation 102 and the portion of isolation plug 106 that are higher than second semiconductor substrate 1003 and protective layer 101 are removed, and transistor 107 is formed within a portion of second semiconductor substrate 1003 disposed between two adjacent shallow trench isolations 102, as shown in FIG. 2F. In other words, the shallow trench isolations and the isolation plugs are coplanar with the upper surface of the second semiconductor layer.

Transistor 107 may be a metal oxide semiconductor field effect transistor (MOSFET) or other types of transistors. In addition, together with formation of transistor 107, other devices such as MEMS devices, integrated passive devices (IPD), and other devices can also be formed. Transistor 107 may be formed using conventional processes available in the art. For example, a gate dielectric layer (not shown), a gate electrode 107a, a gate spacer 107b, a source region (denoted "S"), a drain region (denoted "D"), a channel region (not shown) between the source and drain regions are formed, as shown in FIG. 2F.

Thereafter, a dielectric layer 108 is formed on transistor 107 to insulate transistor 107. Contact via openings are formed above the source and drain regions through dielectric layer 108. Contact via openings can be formed by applying a photoresist and lithographically patterning and etching, as known in the art. Thereafter, a conductive material is deposited into the contact via openings to form contact vias 109 that are in contact with the source/drain regions of the transistor, as shown in FIG. 2F.

The integrated circuit thus formed according to the embodiment of the present invention may be any types of integrated circuits, such as a radio frequency switching device, a radio frequency front-end module (RF FEM), and transistor 107 may be the transistor of the radio frequency switching device. Furthermore, the integrated device may include, in addition to transistor 107, cavity 1051, shallow trench isolation 102, and isolation plug 106, other components disposed on second semiconductor substrate 1003 and other regions (not shown), such as, transistors, MEMS devices, and integrated passive devices. Those skilled in the art will appreciate that other transistors, for example, bipolar junction transistors (BJT), BiCMOS, CMOS, and other active or passive devices may be used without departing from the scope of the present invention.

Because the integrated circuit manufactured by the method of the present invention has a cavity embedded in the semiconductor substrate below the transistor, the transistor is thus separated from the substrate through the cavity. Therefore, parasitic coupling between the source, drain, and gate of the transistor through the semiconductor substrate can be reduced, and parasitic capacitive coupling of the semiconductor substrate can be reduced, thereby improving the performance of the integrated circuit.

Figure 3:
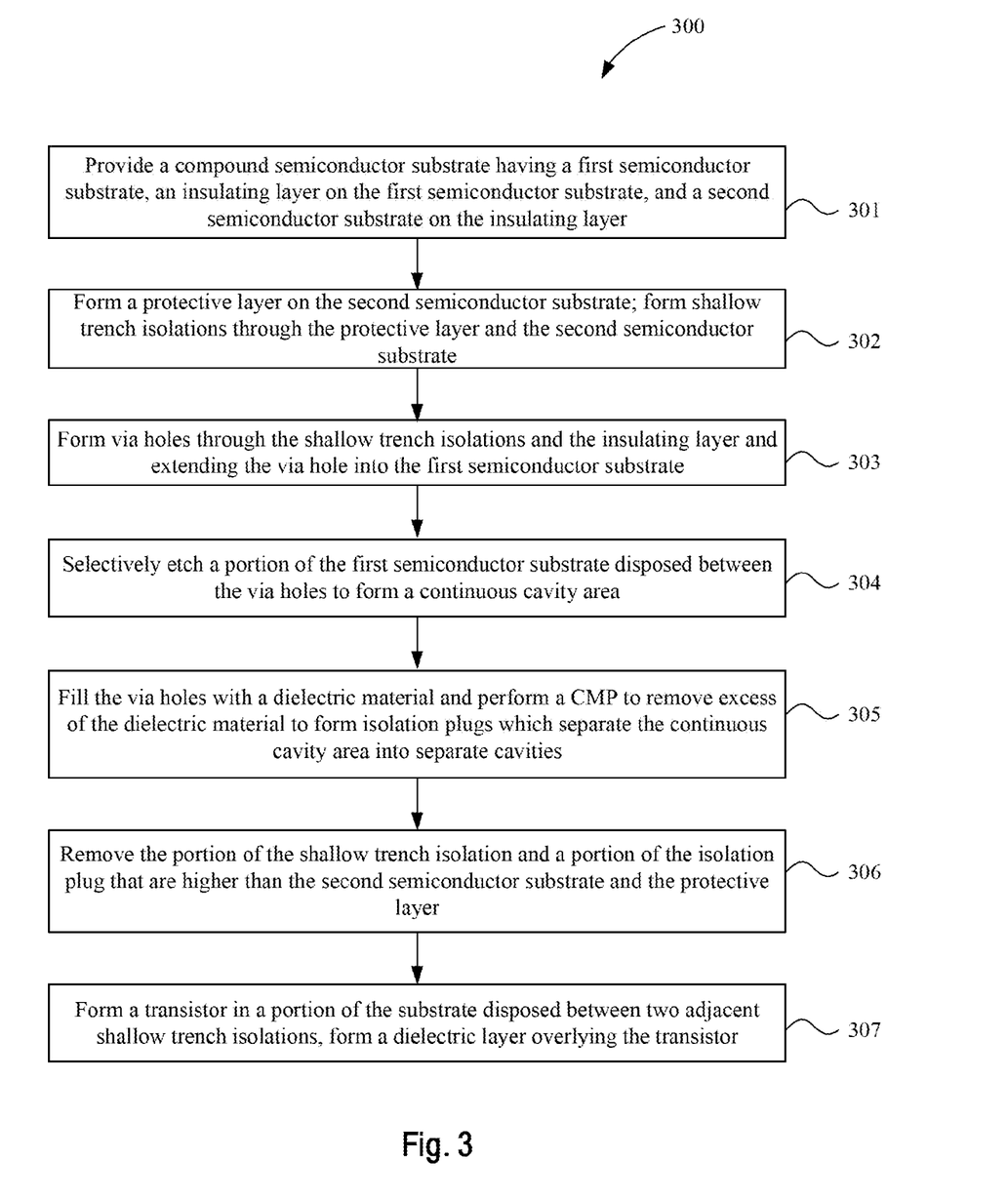
FIG. 3 is a flow chart of a method of manufacturing an integrated circuit according to an embodiment of the present invention.

FIG. 3 is a flow chart of a method 300 of manufacturing an integrated circuit according to an embodiment of the present invention. Method 300 may include:

S301: providing a compound semiconductor substrate 100 having a first semiconductor substrate 1001, an insulating layer 1002 on the first semiconductor substrate, and a second first semiconductor substrate 1003 on the insulating layer (FIG. 2A);

S302: forming a protective layer 101 on the second semiconductor substrate, and forming a shallow trench isolation 102 through the protective layer and the second semiconductor substrate (FIG. 2B);

S303: forming a via hole 104 through the shallow trench isolation and the insulating layer and extending into a portion of the first semiconductor substrate (FIG. 2C);

S304: selectively etching a portion of the first semiconductor substrate disposed between the via holes to form a continuous cavity area 105 (FIG. 2D);

S305: filling the via holes with a dielectric layer and CMP (planarizing) to remove excess of the dielectric material to form isolation plugs 106, the isolation plugs separate the continuous cavity area into multiple separate cavities 1051 (FIG. 2E);

S306: removing the portion of the shallow trench isolation and the portion of the isolation plug that are higher than (protruding over) the second semiconductor substrate and the protective layer;

S307: forming a transistor in a portion of the second semiconductor device disposed between two shallow trench isolations (FIG. 2F).

In an embodiment, method 300 may further include forming contact via openings over the source and drain regions by applying a photoresist, lithographically patterning and etching and filling the contact via openings with a conductive material to form contact vias 109 (FIG. 2F).

Third Embodiment

Embodiments of the present invention also provide an electronic device. The electronic device includes the above-described integration circuit that is manufactured according to the method described above.

Because the integrated circuit has a cavity disposed below the transistor, coupling between the drain, source and gate of the transistor and between the semiconductor substrate can be significantly reduced to improve the performance of the electronic device. The integrated circuit according to embodiments of the present invention can be embedded in electronic devices that have a broad range of applications, such as, but not limited to, cellular phones, tablet PCs, netbooks, game consoles, portable DVD players, portable navigation systems, still and video cameras, digital voice recorders, MP3, MP4, and other electronic products.

The foregoing description has provided by way of exemplary and non-limiting examples a full description of the invention. However, various modifications and adaptations may become apparent to those skilled in the art in view of the foregoing description, when read in conjunction with the accompanying drawings and the appended claims. Thus, such and similar modifications of the teachings of the invention will fall within the scope of this invention.

Furthermore, some of the features of the preferred embodiments of the present invention could be used to advantage without the corresponding use of other features. As such, the foregoing description should be considered as merely illustrative of the principles of the invention, and not in limitation thereof.

What is claimed is:

1. A method of manufacturing an integrated circuit, the method comprising:
   providing a compound semiconductor substrate having a first semiconductor substrate, an insulating layer on the first semiconductor substrate, and a second semiconductor substrate on the insulating layer;
   forming a protective layer on the second semiconductor substrate;
   forming a plurality of shallow trench isolations through the protective layer and the second semiconductor substrate;
   forming a plurality of via holes through the shallow trench isolations and the insulating layer, the via holes extending into a portion of the first semiconductor substrate;
   selectively removing a portion of the first semiconductor substrate disposed between the via holes to form a continuous cavity area;
   filling the via holes with a dielectric material and performing a chemical mechanical polishing process to remove excess of the dielectric material to form a plurality of isolation plugs dividing the continuous cavity area into a plurality of separate cavities;
   removing a portion of the shallow trench isolations and a portion of the isolation plugs higher than the second semiconductor substrate and the protective layer; and
   forming a transistor within a portion of the second semiconductor substrate disposed between two adjacent shallow trench isolations.

2. The method of claim 1, wherein selectively removing the portion of the first semiconductor substrate comprises a wet etching with an aqueous solution of TMAH, KOH, or NH3-H2O.

3. The method of claim 1, wherein the first semiconductor substrate is a silicon layer having a plane orientation (111), and the second semiconductor substrate is a silicon layer having a plane orientation (111).

4. The method of claim 1, wherein the extended portion of a via hole into the first semiconductor substrate has a depth greater than 100 nm.

5. The method of claim 1, further comprising, after forming the transistor, forming a dielectric layer on the transistor.

* * * * *